United States Patent [19]
Cheng

[11] Patent Number: 6,054,389
[45] Date of Patent: Apr. 25, 2000

[54] METHOD OF FORMING METAL CONDUCTING PILLARS

[75] Inventor: Chih-Hsiung Cheng, Hsinchu, Taiwan

[73] Assignee: Vanguard International Semiconductor Corporation, Hsin-Chu, Taiwan

[21] Appl. No.: 08/999,203

[22] Filed: Dec. 29, 1997

[51] Int. Cl.[7] ........................ H01L 21/302; H01L 21/451
[52] U.S. Cl. ............................................ 438/692; 438/700
[58] Field of Search .................................... 438/692, 693, 438/700, 691, 706

[56] References Cited

U.S. PATENT DOCUMENTS

| | | | |
|---|---|---|---|
| 5,100,838 | 3/1992 | Dennison | 437/195 |
| 5,118,385 | 6/1992 | Kumar et al. | 156/644 |
| 5,248,854 | 9/1993 | Kudoh et al. | 174/261 |
| 5,270,259 | 12/1993 | Ito et al. | 438/700 |
| 5,358,902 | 10/1994 | Verhaar et al. | 437/192 |
| 5,502,008 | 3/1996 | Hayakawa et al. | 437/225 |
| 5,677,239 | 10/1997 | Isobe | 438/692 |
| 5,695,601 | 12/1997 | Kodera et al. | 156/345 |
| 5,700,348 | 12/1997 | Sakurai | 438/692 |
| 5,741,741 | 4/1998 | Tseng | 438/700 |
| 5,795,825 | 8/1998 | Sugano et al. | 438/691 |

OTHER PUBLICATIONS

Oda et al. "0.6 $\mu$m Pitch Highly Reliable Multilevel Interconnection Using Hydrogen Silicate Based Inorganic SOG for Sub–Quarter Micron CMOS Technology" 1997 Symposium on VLSI Technology Digest of Technical Papers, pp. 79–80.

List et al. "Integration of Ultra–Low–k Xerogel Gapfill Dielectric for High Performance Sub–0.18 $\mu$m Interconnects", 1997 Symposium on VLSI Technology Digest of Technical Papers, pp. 77–78.

*Primary Examiner*—Benjamin L. Utech
*Assistant Examiner*—Duy-Vu Deo
*Attorney, Agent, or Firm*—George O. Saile; Stephen B. Ackerman; Larry J. Prescott

[57] ABSTRACT

A method of forming electrical contacts between a first level electrode pattern and a second level electrode pattern through an inter-level dielectric is described. The method uses conducting metal pillars. A first level of electrodes is formed on a wafer. Conducting metal pillars are formed over the regions of the first level electrodes where contact is to be made. The conducting metal pillars are formed by depositing a layer of metal and forming the pillars using photolithographic techniques and etching. A layer of inter-level dielectric is then deposited over the conducting metal pillars and planarized thereby exposing the top surface of the pillars.

20 Claims, 6 Drawing Sheets

METHOD OF FORMING METAL CONDUCTING PILLARS

BACKGROUND OF THE INVENTION (1) Field of the Invention

This invention relates to a method of forming conducting metal pillars to provide electrical connection between two levels of electrode patterns.

(2) Description of the Related Art

U.S. Pat. No. 5,248,854 to Kudoh et al. describe a method of forming conducting pillars between two layers of electrode patterns using a method different from the method of this invention. Kudoh et al. describe forming groves in a layer of photoresist and forming electrodes and pillars in the photoresist grooves.

U.S. Pat. No. 5,502,008 to Hayakawa et al. describe a method of forming conducting metal pluge by means of forming holes in a layer of dielectric, depositing a layer of conductor material, and etching back the layer of conducting material to leave conducting material only in the via holes.

U.S. Pat. No. 5,358,902 to Verhaar et al. describes a method of forming conducting metal plugs by means of applying a flowable organic material on a substrate to form an organic layer. Via holes are formed in the organic layer and filled with electrically conductive material. The organic layer is then removed leaving conducting pillars.

U.S. Pat. No. 5,100,838 to Dennison describes a method of forming conducting pillars which includes forming parallel-spaced conductor lines on a substrate, forming insulating spacers on the sidewalls of the conductor lines leaving a gap between the lines, filling the gaps with a conductor film, and etching the film to form conducting pillars.

U.S. Pat. No. 5,118,385 to Kumar et al. describes a method of forming conducting pillars by means of depositing a layer of dielectric over a patterned metal layer, forming via holes in the dielectric, depositing metal into the via holes, and planarizing the top of the structure leaving metal pillars in the via holes.

A paper entitled "0.6 $\mu$m Pitch Highly Feliable Multilevel Interconnection Using Hydrogen Silicate Based Inorganic SOG for Sub-Quarter Micron CMOS Technology", by N. Oda et al., 1997 Symposium on VLSI Technology Digest of Technical Papers, pages 79–80 describes an interconnection technology using a low dielectric constant Hydrogen Silicate Based Inorganic Spin On Glass as an insulator.

A paper entitled "Integration of Ultra-Low-k Xerogel Gapfill Dielectric for High Performance Sub 0.18 $\mu$m Interconnects", by R. S. List et al., 1997 Symposium on VLSI Technology Digest of Technical Papers, pages 77–78 describes an inter-layer dielectric film having a low dielectric constant.

This invention describes a method of forming conducting metal pillars for interconnecting two levels of electrode patterns. The pillars are etched from a blanket layer of metal deposited on a wafer. The inter-level dielectric is then deposited over the pillars.

SUMMARY OF THE INVENTION

In integrated circuit wafers using two or more levels of conducting metal electrodes separated by an inter-level dielectric there is a need for conducting paths through the inter-level dielectric to interconnect. electrodes on different levels. These conducting paths are usually conducting plugs, formed of a metal such as tungsten, formed in the dielectric. The conventional method is to form one level of conducting electrodes and to deposit a layer of inter-level dielectric over these conducting electrodes. Via holes are then etched in the inter-level dielectric at the positions where the conducting metal plugs are to be formed. Metal, such as tungsten, is then deposited on the wafer filling the via holes etched in the layer of inter-level dielectric. The excess metal is then removed using a method such as etchback, chemical mechanical polishing, or the like.

The next level of conducting electrodes are then formed on the layer of inter-level dielectric and the metal plugs in the inter-level dielectric provide electrical connection between the two levels of conducting electrodes. This method of forming interconnection between two levels of conducting electrodes requires a number of process steps and typically uses a metal such as tungsten.

It is an objective of this invention to form metal conducting pillars in a layer of inter-level dielectric which will require fewer processing steps than the formation of metal plugs and will permit the use of high conducting metals such as aluminum or the like.

In order to achieve this objective a first dielectric layer is deposited on the first level of conducting metal electrodes and planarized such that a thin layer of first dielectric remains over the first level of conducting metal electrodes. Holes are then etched in the first dielectric layer exposing those parts of the first dielectric layer where the conducting pillars will contact the first level of conducting metal electrodes. A metal layer is then deposited and patterned to form metal pillars covering the holes formed in the first dielectric layer, which also acts as an etch stop.

A layer of inter-level dielectric is then deposited covering the metal pillars. The inter-level dielectric is then planarized so that the all the inter-level dielectric is removed from the top of the metal pillars. A layer of metal is then deposited on the planarized inter-level dielectric and patterned to form the second layer of metal electrodes.

DESCRIPTION OF THE PREFERRED EMBODIMENTS

Figure 1:
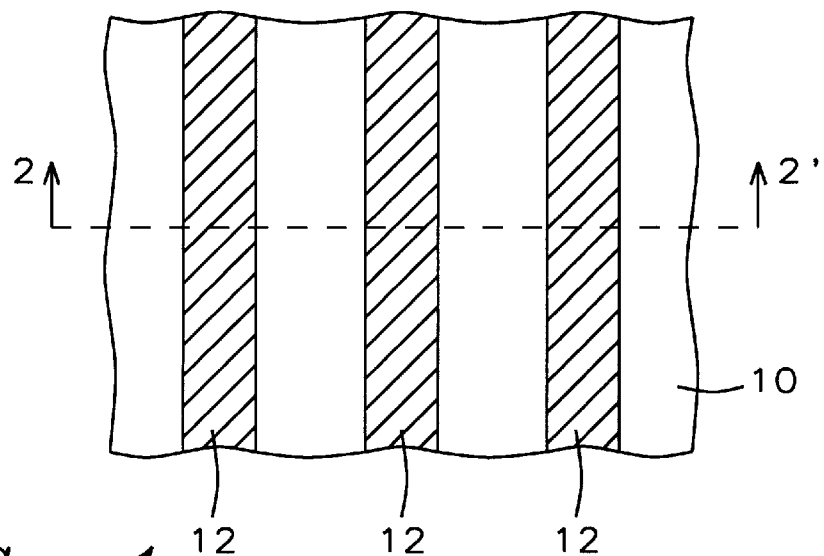
FIG. 1 shows a top view of a semiconductor integrated circuit wafer having a patterned layer of first metal formed thereon thereby forming a number of parallel lines.
Figure 2:
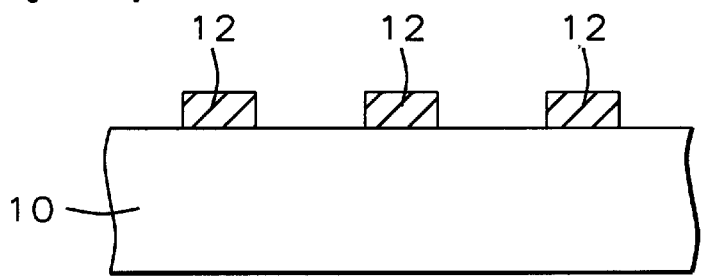
FIG. 2 shows a cross section view of the wafer of FIG. 1 along the line 2–2' of FIG. 1.

One of the preferred embodiments of this invention will now be described in detail with reference to FIGS. 1–11. FIG. 1 shows a top view of a part of an integrated circuit wafer 10. A layer of first conducting material, such as aluminum, aluminum copper, aluminum copper silicon, polysilicon or the like has been deposited on the integrated circuit wafer and patterned forming a number of first level electrodes 12. FIG. 1 shows the first level electrodes 12 as parallel electrodes. FIG. 2 shows a cross section view of the part of the integrated circuit wafer 10 shown in FIG. 1 taken along line 2–2' in FIG. 1. FIG. 2 shows the first level electrodes 12 which will make contact with the conducting metal pillar. There may be devices formed in the wafer 10 which are not shown. There may be one or more dielectric layers between the wafer 10 and the first level electrodes 12, 14 which are not shown. FIGS. 1 and 2 show the example wherein the first level electrodes 12 are a number of parallel electrodes, however those skilled in the art will readily recognize that other patterns formed in the layer of first conducting material will work equally well.

Figure 3:
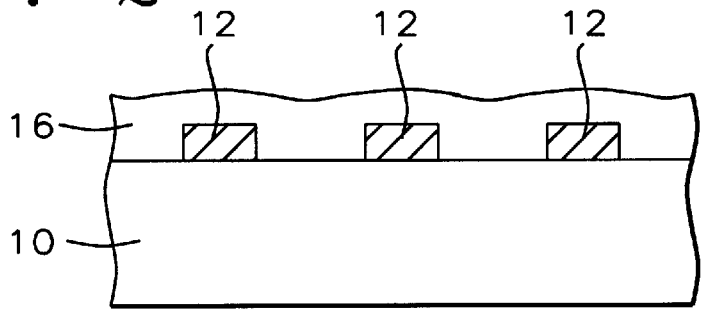
FIG. 3 shows a cross section view of the integrated circuit wafer after forming a layer of first dielectric on the wafer.
Figure 4:
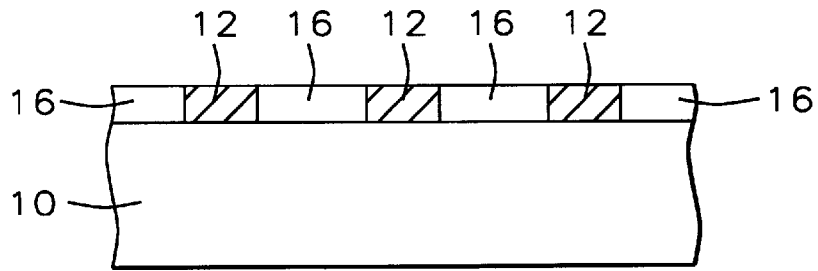
FIG. 4 shows a cross section view of the integrated circuit wafer after planarizing the layer of first dielectric.
Figure 5:
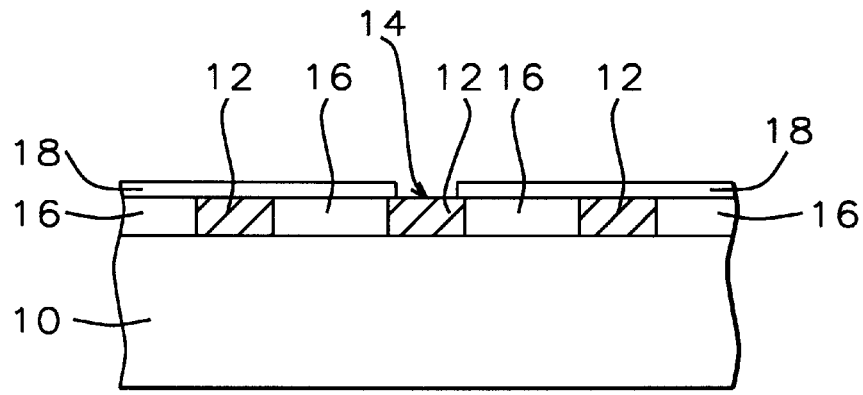
FIG. 5 shows a cross section view of the integrated circuit wafer with a layer of second dielectric formed on the planarized layer of first dielectric and via holes etched in the layer of second dielectric.

As shown in FIG. 3 a layer of first dielectric 16, such as silicon dioxide, is then deposited on the wafer 10 covering the first level electrodes 12. As shown in FIG. 4 the layer of first dielectric is planarized using a method such as chemical mechanical polishing such that all of that part of the layer of first dielectric 16 above the plane of the top surface of the first level electrodes 12 is removed thereby exposing the top surface of the first level electrodes 12. As shown in FIG. 5, a thin layer of second dielectric 18, such as silicon dioxide having a thickness of between about 100 and 300 Angstroms is deposited on the wafer 10 covering the first level electrodes 12. A via hole is then etched in the layer of second dielectric 18 exposing a contact region 14 of the first level electrode which is to make contact to the conducting metal pillar.

Figure 6:
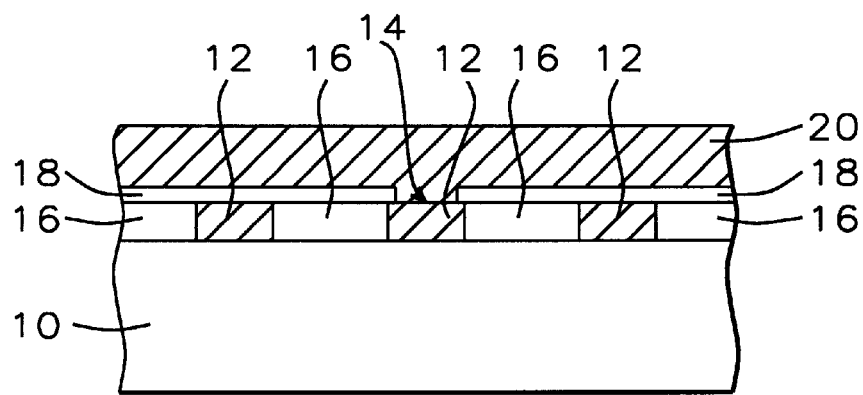
FIG. 6 shows a cross section view of the integrated circuit wafer after forming a layer of second metal over the layer of second dielectric.
Figure 7:
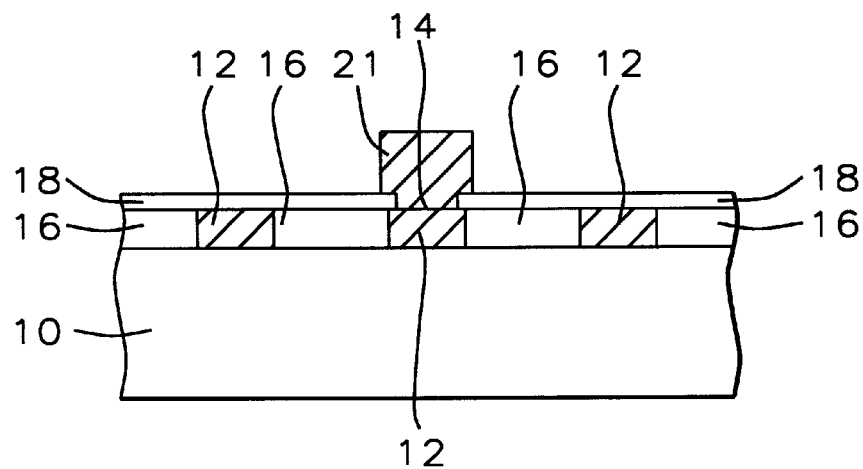
FIG. 7 shows a cross section view of the integrated circuit wafer after the layer of second metal has been etched to form the conducting metal pillars.

Next, as shown in FIG. 6, a layer of second conducting material 20 is deposited on the wafer making physical and electrical contact with the contact region 14 of the first level electrode which will make contact to the conducting metal pillar. In this example the layer of second conducting material 20 is a layer of aluminum, tungsten, copper, or the like having a thickness of between about 2000 and 8000 Angstroms. Next, as shown in FIG. 7, a conducting metal pillar 21 is formed by means of Etching away the layer of second conducting material except that part of the layer of second conducting material directly over the contact region 14 of the first level electrode making contact to the conducting metal pillar 21. In forming the metal pillar 21 the second conducting material is etched using photolithographic techniques, dry anisotropic etching methods, and the layer of second dielectric 18 as an etch stop protecting the first level electrodes 12.

Figure 8:
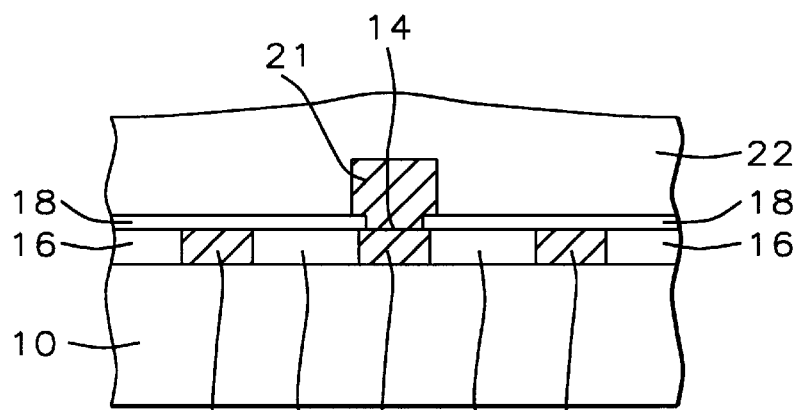
FIG. 8 shows a cross section view of the integrated circuit wafer after depositing a layer of inter-level dielectric on the wafer covering the conducting metal pillars.
Figure 9:
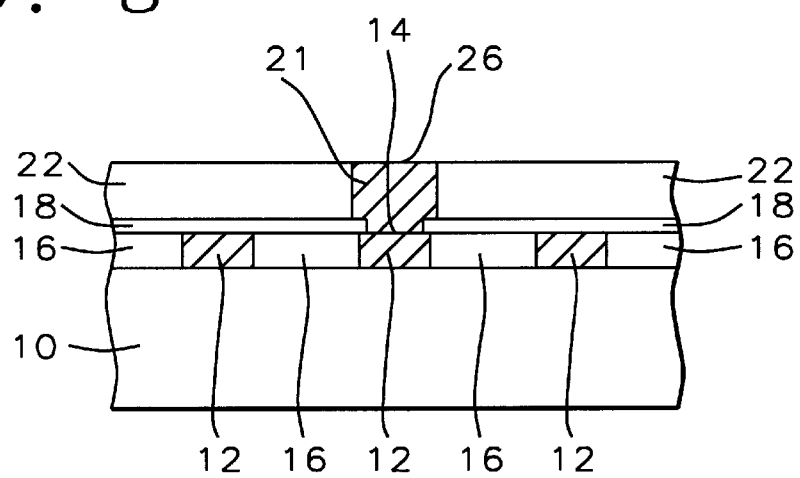
FIG. 9 shows a cross section view of the integrated circuit wafer after the layer of inter-level dielectric has been planarized thereby exposing the top surface of the conducting metal pillars.

Next, as shown in FIG. 8, a layer of third dielectric 22, such as silicon dioxide, $SiO_2$ or silicon nitride, $Si_3N_4$, having a thickness of between about 2000 and 15,000 Angstroms is deposited on the wafer 10 covering the conducting metal pillar 21. As shown in FIG. 9, the layer of third dielectric 22 is planarized, using a method such as chemical mechanical polishing, thereby exposing the top surface 26 of the conducting metal pillar 21.

Figure 10:
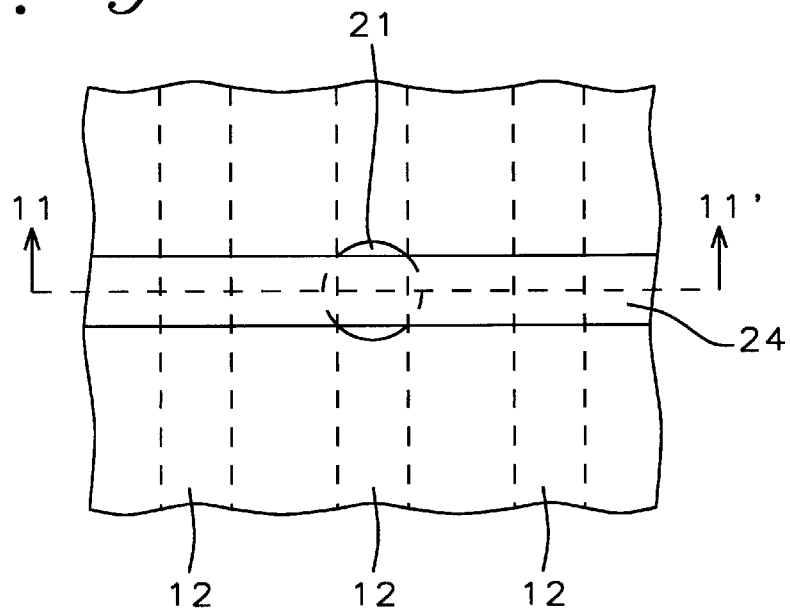
FIG. 10 shows a top view of the semiconductor integrated circuit wafer after a layer of third metal has been deposited over the planarized layer of inter-level dielectric and patterned thereby forming a number of parallel lines.
Figure 11:
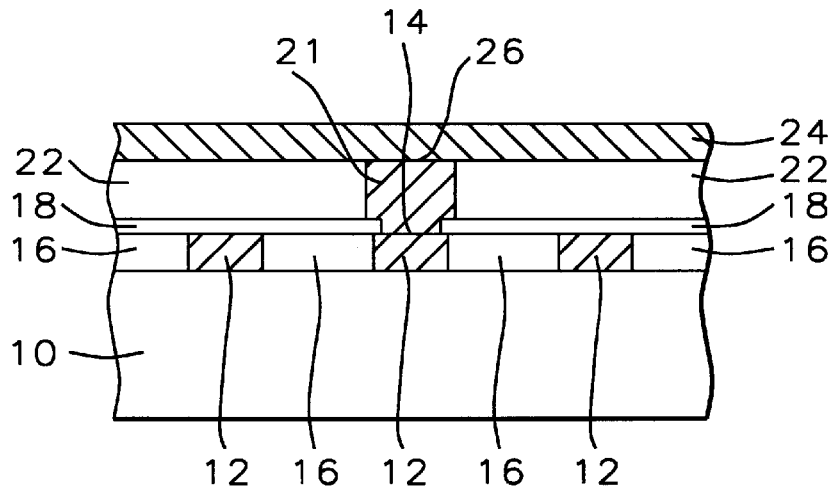
FIG. 11 shows a cross section view of the integrated circuit wafer, taken along the line 11–11' of FIG. 10, after a layer of third metal has been deposited over the planarized layer of inter-level dielectric and patterned.

Next, as shown in FIGS. 10 and 11, a layer of third conducting material, such as aluminum or aluminum copper, is deposited on the wafer 10 and patterned thereby forming second level electrodes 24. The second level electrodes make physical and electrical contact with the top surface 26 of the conducting metal pillar 21. FIG. 10 shows the top view and FIG. 11 the cross section view, along the line 11–11' of FIG. 10, of the wafer after the second level electrodes 24 have been formed. This method of forming the conducting metal pillar avoids the steps of etching via holes in the inter-level dielectric, filling the via holes with metal for a conducting metal plug, and back etching the metal for a conducting metal plug.

Refer now to FIGS. 1–3 and FIGS. 12–17 for another preferred embodiment of the method of forming a conducting metal pillar of this invention. As shown in FIGS. 1–3 this embodiment proceed exactly as the preceding embodiment through the step of depositing a layer of first dielectric on the wafer. FIG. 1 shows a top view of a part of an integrated circuit wafer 10. A layer of first conducting material, such as aluminum, aluminum copper, aluminum copper silicon, polysilicon or the like has been deposited on the integrated circuit wafer and patterned forming a number of first level electrodes 12. FIG. 2 shows a cross section view of the part of the integrated circuit wafer 10 shown in FIG. 1 taken along line 2–2' in FIG. 1.

Figure 12:
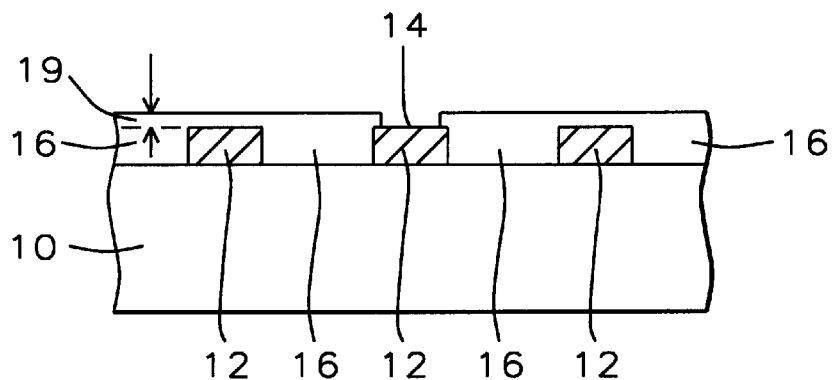
FIG. 12 shows a cross section view of the integrated circuit wafer after planarizing the layer of first dielectric. Via holes have been formed in the layer of first dielectric.

As shown in FIG. 3 a layer of first dielectric 16, such as silicon dioxide, is then deposited on the wafer 10 covering the first level electrodes 12. As shown in FIG. 12 the layer of first dielectric is planarized using a method such as chemical mechanical polishing such that all of that part of the layer of first dielectric 16 above a plane which is a first thickness 19 above the top surface of the first level electrodes 12 is removed. The first thickness is between about 100 and 300 Angstroms. A via hole is then etched in the layer of first dielectric 16 exposing a contact region 14 of the first level electrode which is to make contact to the conducting metal pillar.

Figure 13:
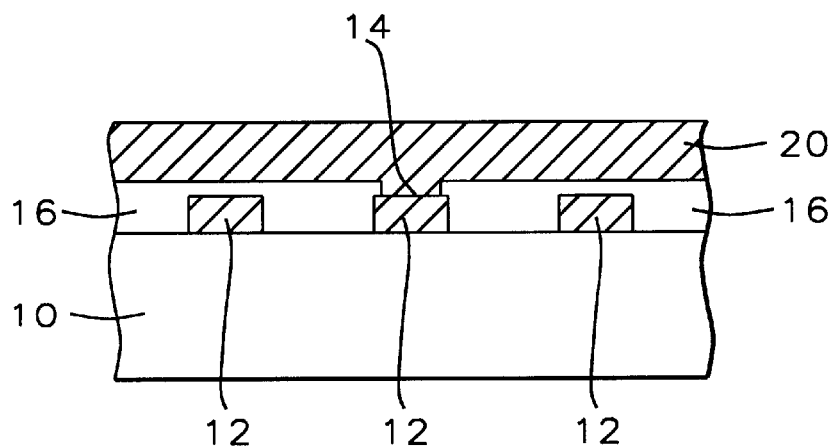
FIG. 13 shows a cross section view of the integrated circuit wafer after forming a layer of second metal over the layer of first dielectric.
Figure 14:
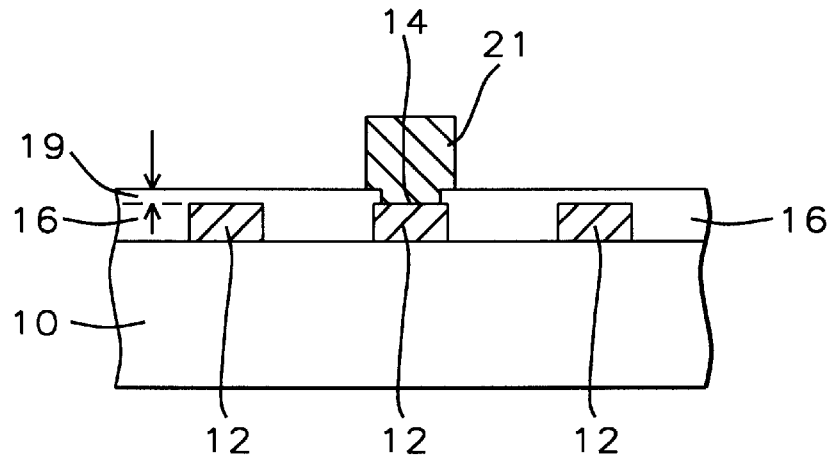
FIG. 14 shows a cross section view of the integrated circuit wafer after the layer of second metal has been etched to form the conducting metal pillars.

Next, as shown in FIG. 13, a layer of second conducting material 20 is deposited on the wafer 10 making physical and electrical contact with the contact region 14 of the first level electrode making contact to the conducting metal pillar. In this example the layer of second conducting material 20 is a layer of aluminum, tungsten, copper, or the like having a thickness of between about 2000 and 8000 Angstroms. Next, as shown in FIG. 14, a conducting metal pillar 21 is formed by means of etching away the layer of second conducting material excert that part of the layer of second conducting material directly over the contact region 14 of the first level electrode making contact to the conducting metal pillar 21. In forming the metal pillar 21 the second conducting material is etched using photolithographic techniques, dry anisotropic etching methods, and the first thickness 19 of the layer of first dielectric 16 as an etch stop protecting the first level electrodes 12 which do not make contact to the conducting metal pillar 21.

Figure 15:
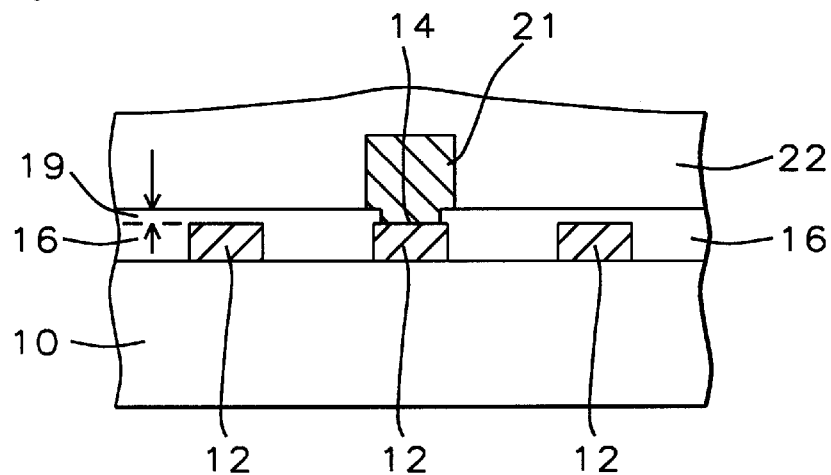
FIG. 15 shows a cross section view of the integrated circuit wafer after depositing a layer of inter-level dielectric on the wafer covering the conducting metal pillars.
Figure 16:
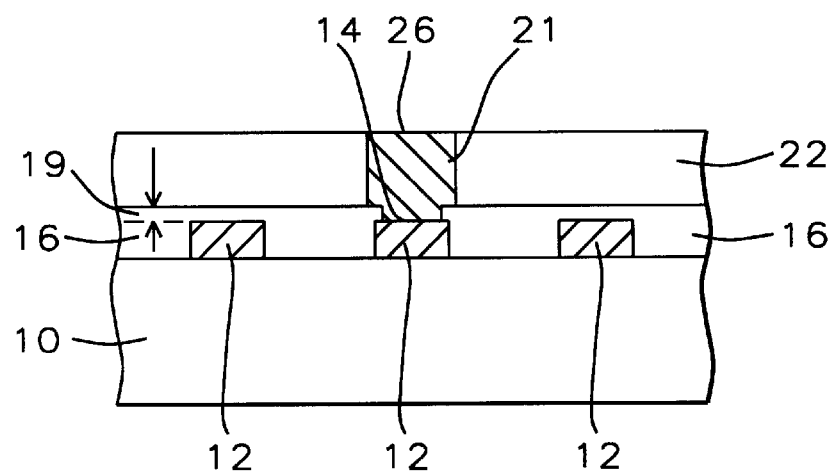
FIG. 16 shows a cross section view of the integrated circuit wafer after the layer of inter-level dielectric has been planarized thereby exposing the top surface of the conducting metal pillars.

Next, as shown in FIG. 15, a layer of second dielectric 22, such as silicon dioxide, $SiO_2$ or silicon nitride, $Si_3N_4$, having a thickness of between about 2000 and 15,000 Angstroms is deposited on the wafer 10 covering the conducting metal pillar 21. As shown in FIG. 16, the layer of second dielectric 22 is planarized, using a method such as chemical mechanical polishing, thereby exposing the top surface 26 of the conducting metal pillar 21.

Figure 17:
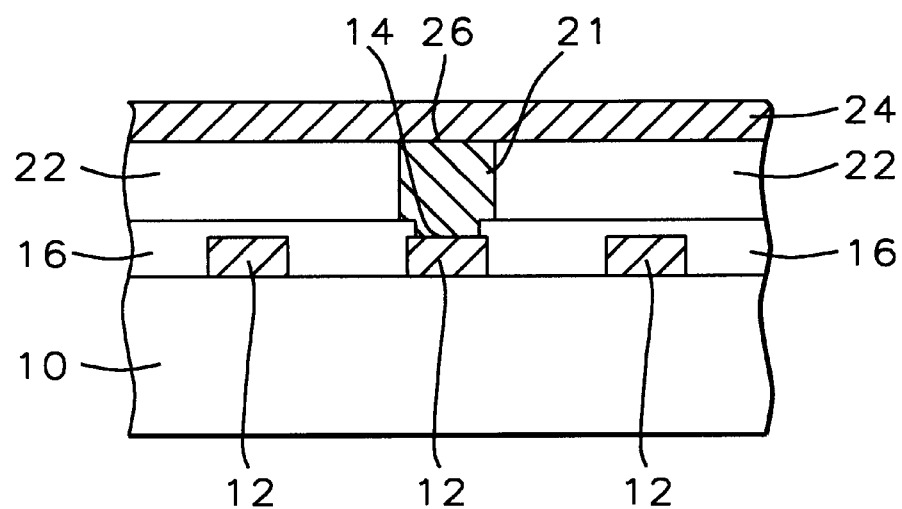
FIG. 17 shows a cross section view of the integrated circuit wafer after the second level electrodes have been formed.

Next, as shown in FIG. 17, a layer of third conducting material, such as aluminum or aluminum copper, is deposited on the wafer 10 and patterned thereby forming second level electrodes 24. The second level electrodes make physical and electrical contact with the top surface 26 of the conducting metal pillar 21.

While the invention has been particularly shown and described with reference to the preferred embodiments thereof, it will be understood by those skilled in the art that various changes in form and details may be made without departing from the spirit and scope of the invention.

What is claimed is:

1. A method of forming an inter-level contact plug, comprising the steps of:

providing a substrate having a patterned layer of first metal formed thereon, wherein said patterned layer of first metal has a number of contact regions;

depositing a layer of first dielectric on said substrate wherein said first dielectric covers said patterned layer of first metal;

planarizing said layer of first dielectric thereby exposing said patterned layer of first metal;

depositing a layer of second dielectric having a first thickness on said planarized layer of first dielectric thereby covering said patterned layer of first metal with said first thickness of said second dielectric;

etching contact holes through that part of said second dielectric directly above said contact regions thereby exposing said contact regions of said patterned layer of first metal;

depositing a layer of second metal on said layer of second dielectric, after etching said contact holes, wherein said layer of second metal makes physical and electrical contact with said contact regions of said patterned layer of first metal;

etching away a part of said layer of second metal using said layer of second dielectric as an etch stop and lithographic techniques, thereby forming a number of second metal contact pillars equal to said number of contract regions wherein each of said contact pillars has a first surface and a second surface, each of said contact regions of said patterned layer of first metal is covered by one of said contact pillars, and said second surface of each of said contact pillars makes physical and electrical contact with one of said contact regions of said patterned layer of first metal;

depositing a layer of third dielectric on said substrate after forming said second metal contact pillars wherein said layer of third dielectric covers said second metal contact pillars;

planarizing said layer of third dielectric thereby exposing said first surface of each of said contact pillars;

depositing a layer of third metal on said substrate after planarizing said layer of third dielectric wherein said layer of third metal makes physical and electrical contact with said first surface of each of said contact pillars; and patterning said layer of third metal.

2. The method of claim 1 wherein said first dielectric silicon dioxide.

3. The method of claim 1 wherein said second dielectric silicon dioxide.

4. The method of claim 1 wherein said first thickness is between about 100 and 300 Angstroms.

5. The method of claim 1 wherein said layer of second metal is aluminum having a thickness of between about 2000 and 8000 Angstroms.

6. The method of claim 1 wherein said layer of second metal is tungsten having a thickness of between about 2000 and 8000 Angstroms.

7. The method of claim 1 wherein said layer of second metal is copper having a thickness of between about 2000 and 8000 Angstroms.

8. The method of claim 1 wherein said third dielectric is silicon dioxide.

9. The method of claim 1 wherein said third dielectric is silicon nitride.

10. The method of claim 1 wherein said planarizing said layer of first dielectric is accomplished using chemical mechanical polishing.

11. The method of claim 1 wherein said planarizing said layer of third dielectric is accomplished using chemical mechanical polishing.

12. A method of forming an inter-level contact plug, comprising the steps of:

providing a substrate having a patterned layer of first metal formed thereon, wherein said patterned layer of first metal has a number of contact regions;

forming a planarized layer of first dielectric on said substrate wherein a first thickness of said first dielectric covers said patterned layer of first metal;

etching contact holes through that part of said first dielectric directly above said contact regions thereby exposing said contact regions of said patterned layer of first metal;

depositing a layer of second metal on said planarized layer of first dielectric, after etching said contact holes, wherein said layer of second metal makes physical and electrical contact with said contact regions of said patterned layer of first metal;

etching away a part of said layer of second metal using said layer of first dielectric as an etch stop and lithographic techniques, thereby forming a number of second metal contact pillars equal to said number of contact regions wherein each of said contact pillars has a first surface and a second surface, each of said contact regions of said patterned layer of first metal is covered by one of said contact pillars, and said second surface of each of said contact pillars makes physical and electrical contact with one of said contact regions of said patterned layer of first metal;

depositing a layer of second dielectric on said substrate after forming said second metal contact pillars wherein said layer of second dielectric covers said second metal contact pillars;

planarizing said layer of second dielectric thereby exposing said first surface of each of said contact pillars;

depositing a layer of third metal on said substrate after planarizing said layer of second dielectric wherein said layer of third metal makes physical and electrical contact with said first surface of each of said contact pillars; and patterning said layer of third metal.

13. The method of claim 12 wherein said first dielectric silicon dioxide.

14. The method of claim 12 wherein said first thickness is between about 100 and 300 Angstroms.

15. The method of claim 12 wherein said layer of second metal is aluminum having a thickness of between about 2000 and 8000 Angstroms.

16. The method of claim 12 wherein said layer of second metal is tungsten having a thickness of between about 2000 and 8000 Angstroms.

17. The method of claim 12 wherein said layer of second metal is copper having a thickness of between about 2000 and 8000 Angstroms.

18. The method of claim 12 wherein said second dielectric is silicon dioxide.

19. The method of claim 12 wherein said second dielectric is silicon nitride.

20. The method of claim 12 wherein said planarizing said layer of second dielectric is accomplished using chemical mechanical polishing.

* * * * *